(12) United States Patent  
Lim

(10) Patent No.: US 7,842,883 B2  
(45) Date of Patent: Nov. 30, 2010

(54) POWER LINE ARRANGEMENT

(75) Inventor: Jun Youl Lim, Gunpo-si (KR)

(73) Assignee: LG-Nortel Co., Ltd., Seoul (KR)

( * ) Notice: Subject to any disclaimer, the term of this patent is extended or adjusted under 35 U.S.C. 154(b) by 0 days.

(21) Appl. No.: 12/262,413

(22) Filed: Oct. 31, 2008

(65) Prior Publication Data

US 2009/0115260 A1    May 7, 2009

(30) Foreign Application Priority Data

Nov. 7, 2007    (KR)    ............ 10-2007-0113297

(51) Int. Cl.
*H01B 11/02*    (2006.01)
*H05K 9/00*    (2006.01)
*H04B 3/28*    (2006.01)

(52) U.S. Cl. .................. 174/27; 174/32; 333/12
(58) Field of Classification Search .............. 174/33, 174/27, 268, 72 R, 32; 307/147; 361/827
See application file for complete search history.

(56) References Cited

U.S. PATENT DOCUMENTS

| 4,356,462 | A |  | 10/1982 | Bowman |
| 5,039,824 | A |  | 8/1991 | Takashima et al. |
| 5,397,862 | A | * | 3/1995 | Bockelman et al. ......... 174/250 |
| 5,414,393 | A | * | 5/1995 | Rose et al. .................... 333/1 |
| 6,300,846 | B1 | * | 10/2001 | Brunker ....................... 333/1 |
| 2003/0189471 | A1 |  | 10/2003 | Jain |
| 2004/0243204 | A1 | * | 12/2004 | Maghribi et al. ............ 607/115 |
| 2005/0093642 | A1 | * | 5/2005 | Yamada ........................ 333/12 |
| 2006/0251188 | A1 | * | 11/2006 | Crawley et al. ............ 375/319 |
| 2007/0145545 | A1 | * | 6/2007 | Rai et al. ...................... 257/664 |

FOREIGN PATENT DOCUMENTS

WO    WO 00/77880    12/2000

OTHER PUBLICATIONS

Korean Office Action dated May 28, 2009.
European Search Report dated Feb. 25, 2010.
European Search Report dated Aug. 13, 2010.

\* cited by examiner

*Primary Examiner*—Hung S Bui
*Assistant Examiner*—Steven Sawyer
(74) *Attorney, Agent, or Firm*—KED & Associates LLP

(57) ABSTRACT

A power line arrangement includes a first power line and a second power line which crosses the first power line at least once. The first and second power lines are connected to a same power supply, and current in the first power line flows in a different direction from current in the second power line at an area where the first and second power lines cross.

17 Claims, 6 Drawing Sheets

POWER LINE ARRANGEMENT

BACKGROUND

1. Field

One or more embodiments described herein relate to power lines.

2. Background

Many electronic devices on a circuit board have inputs coupled to a power line. Clock generators and DC-DC converters are examples of these devices. Power lines can serve as a source of noise under certain circumstances. For example, one type of noise known as common-mode noise can radiate from a power line between inputs of board-mounted devices and ground. Common-mode noise is a leading cause electromagnetic interference (EMI), which propagates between devices along power and other circuit lines.

Attempts have been made to reduce the EMI generated by common-mode noise. One technique involves forming each power line as a single strip. This technique has proven ineffective and, in fact, can induce the generation of standing waves that increase the adverse effective of common-mode noise-generated EMI.

BRIEF DESCRIPTION OF THE DRAWINGS

The embodiments will be described in detail with reference to the following drawings in which like reference numerals refer to like elements wherein.

DETAILED DESCRIPTION

Figure 1:
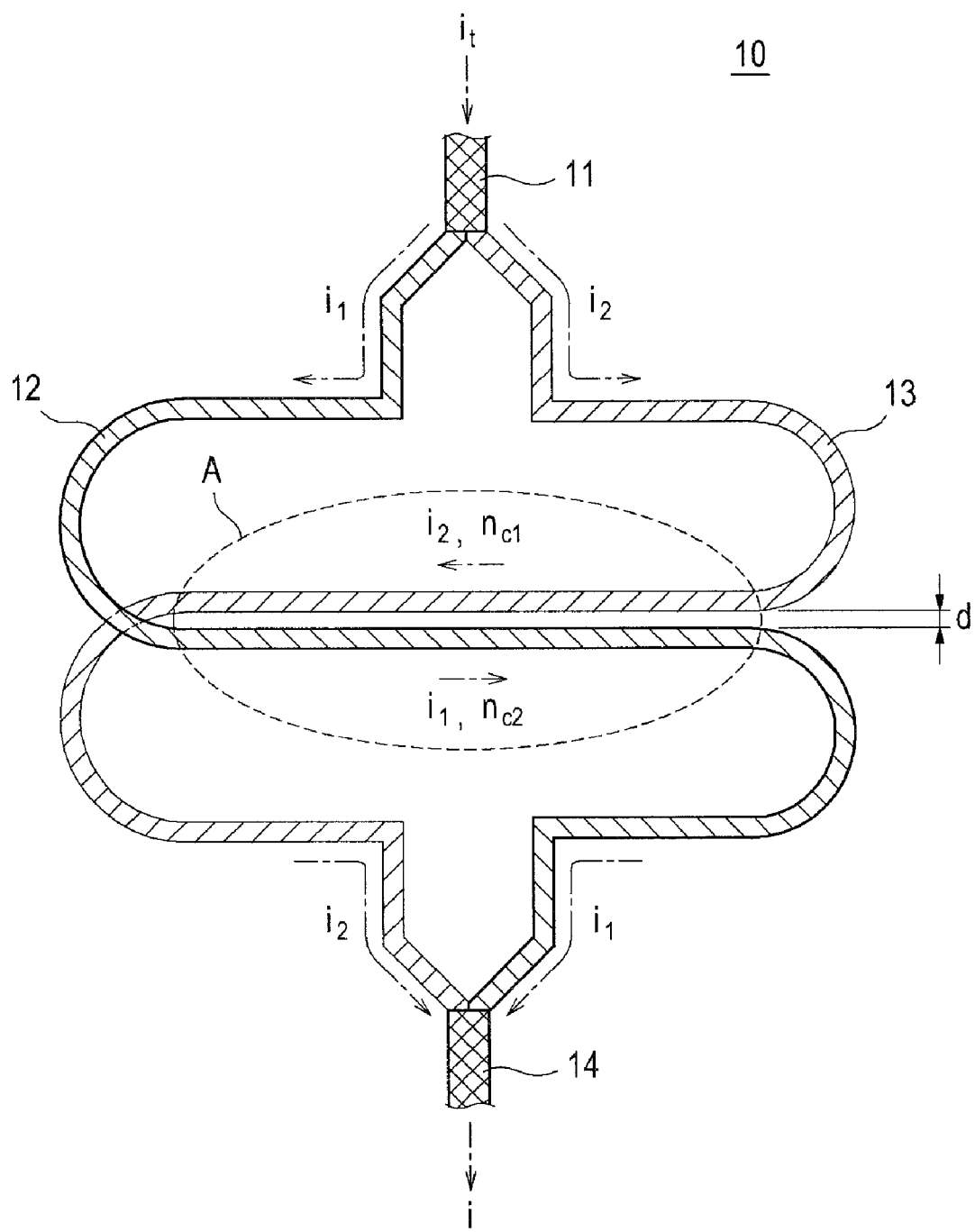
FIG. 1 is a diagram of one embodiment of a power line arrangement.

FIG. 1 shows one embodiment of a power line 10 having two ends 11 and 14. From end 11, a pair of power lines 12 and 13 branch off and extend in different (e.g., opposing) directions. Power lines 12 and 13 may have one or more common properties, e.g., resistance. As further shown in FIG. 1, at least one cross area A is formed between power lines 12 and 13. The directions in which current flows in the power lines may be different. This may be accomplished by aligning the power lines in a manner which allows the different current directions to be formed at the cross area. Also, power lines 12 and 13 may be aligned in two or three dimensions so as to form opposing current directions at the cross area.

At cross area A, the power lines may have a chain or twist shape but they do not necessarily contact each other in this area. For example, power lines 12 and 13 branch off from end 11, meet at cross area A, and extend away again to escape the cross area A. At the other end 14, the two power lines meet and are coupled, for example, to a power input of an electronic device element or are grounded.

In terms of signal propagation, from end 11 current it is divided into currents $i_1$ and $i_2$ that flow respectively through power lines 12 and 13. In the case where the power lines have a same resistance, the magnitudes of currents $i_1$ and $i_2$ will be equal or at least substantially so. With these currents, the same amount of common-mode noise $n_{c1}$ and $n_{c2}$ are generated on power lines 12 and 13.

According to one embodiment, end 11 of power line 10 is coupled to a direct current (DC) power supply. As a result, DC current will flow into power lines 12 and 13 and therefore neither the power lines nor the signals flowing through them will affect each other. Thus, noise components (e.g., common-mode noise and EMI) can be eliminated or reduced without adversely affecting or causing any induction of other or nearby components.

Figure 2:
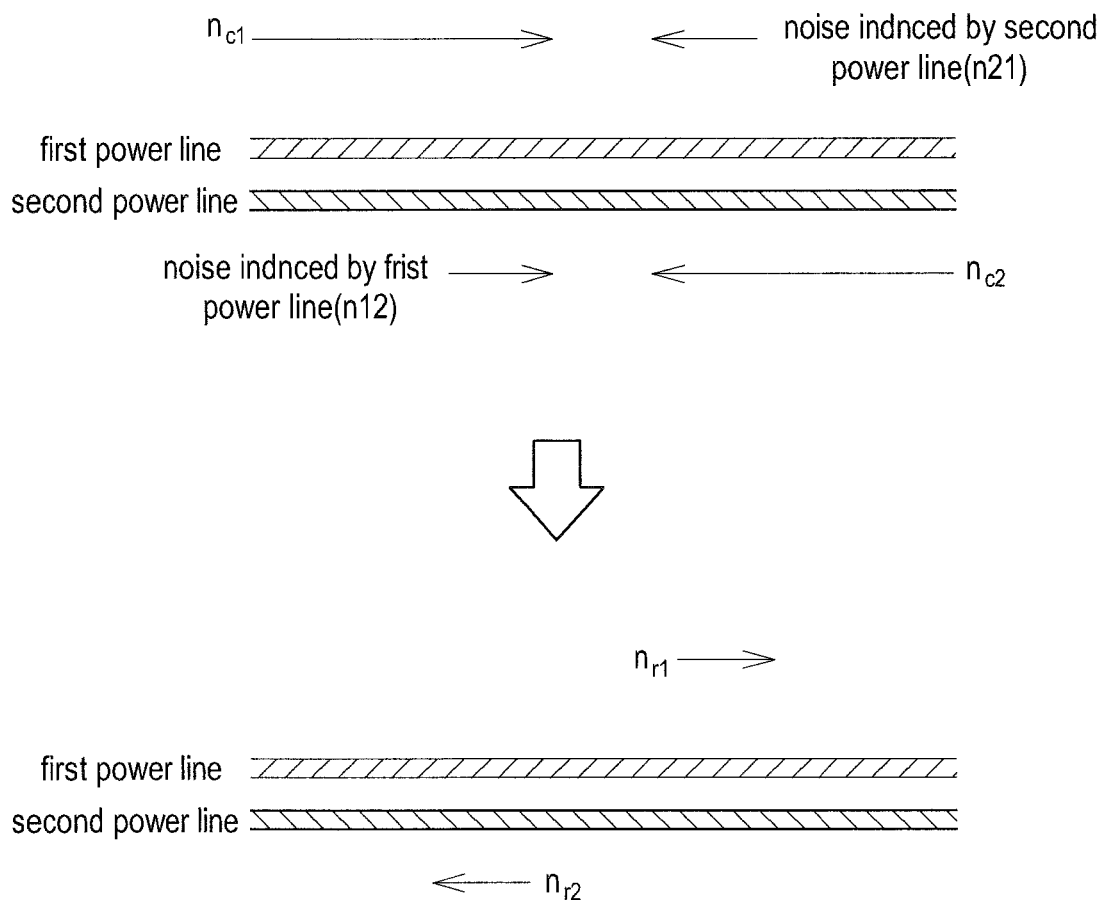
FIG. 2 is a conceptual diagram illustrating a principle of noise reduction that may be achieved in the power line arrangement of FIG. 1.

FIG. 2 illustrates one principle of how noise (and EMI) can be reduced or eliminated in the power line of FIG. 1. If the direction of current $i_1$ flowing through power line 12 in cross area A is defined as the "+" direction, then the direction of current $i_2$ flowing through power line 13 has an opposite direction, i.e., the "−" direction. In cross area A, common-mode noise components $n_{21}$ and $n_{12}$ are generated on/by power lines 12 and 13, respectively, due to currents $i_2$ and $i_1$. That is, common-mode noise component $n_{21}$ generated by current $i_2$ flowing through power line 13 is induced on power line 12, through which current $i_1$ flows. Likewise, common-mode noise component $n_{12}$ generated by current $i_1$ through power line 13 is induced on second power line 13, through which current $i_2$ flows. Because these noise-components are equal (or at least substantially so) and opposite, they reduce or cancel one another out in each power line.

The relationship between common-mode noise components $n_{12}$ and $n_{12}$ induced on power lines 12 and 13 can be expressed as Equation 1:

$$n_{12} = k\, n_{c1} \tag{1}$$

In Equation 1, coupling coefficient "k" depends on the widths of and distances between the power lines. In accordance with one embodiment, the coupling coefficient k may be arbitrarily set within a range from 0 to 1 (0<k<1). Alternatively, as the distance between the power lines becomes smaller and the widths of power lines become narrower, the coupling coefficient k may be set to become larger. Also, the distance between the lines may have more effect on the coupling coefficient than the widths of the lines.

In cross area A, the noise in second power line 13 is reduced as much as $n_{r2}$ as defined in Equation 2:

$$n_{r2} = n_{c2} - n_{12} = n_{c2} - k n_{c1} \tag{2}$$

If the power lines have the same resistance, and $n_{c2}$ becomes equal to $n_{c1}$ ($n_{c2} = n_{c1}$), then the noise reduction $n_{r2}$ can be provided as Equation 3.

$$n_{r2} = (1-k) n_{c2} \tag{3}$$

From Equation 3, it is apparent that, in cross area A, common-mode noise of power line 13 may be reduced as much as (1−k) times. Common-mode noise of power line 12 may be reduced in a similar manner. Consequently, the noise $n_{r1}$ of power line 12 and the noise $n_{r2}$ of power line 13 may be reduced.

Figure 4:
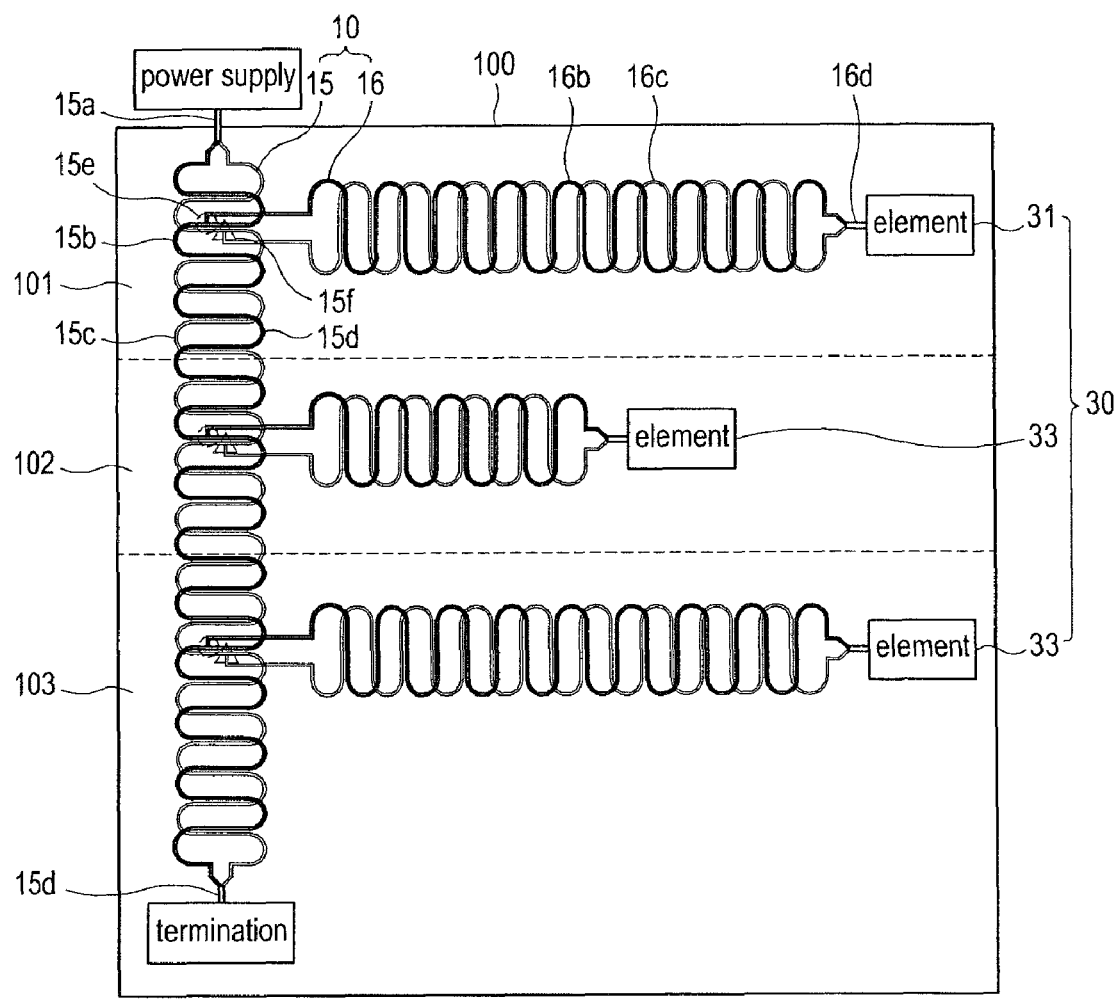
FIG. 4 is a diagram showing one arrangement of connections between one or more power lines formed according to the embodiment of FIG. 1 and other electronic devices.

As shown in FIG. 4, in accordance with another embodiment power line 10 may have a plurality of cross areas. In this case, noise reduction or elimination results in each cross area based on the aforementioned principles. When there are N cross areas (N>1), total noise reduction $n_{r2}$ of power line 13 can be expressed by Equation 4.

$$n_{r2}=(1-k)\times(1-k)\times(1-k)\ldots\times(1-k)n_{c2}=(1-k)^N n_{c2} \quad (4)$$

From Equation 4, it is evident that as the number of cross areas increases, common-mode noise in power line 13 decreases by a geometric progression compared to a power line that does not have any cross areas. Common-mode noise in power line 12 may be reduced in a similar manner.

According to one alignment scheme, in every cross area A power lines 12 and 13 may or may not be parallel to each other. For example, in one or more cross areas power lines 12 and 13 may be parallel to one another, and in one or more other cross areas power lines 12 and 13 may not be parallel to one another.

Figure 3A:
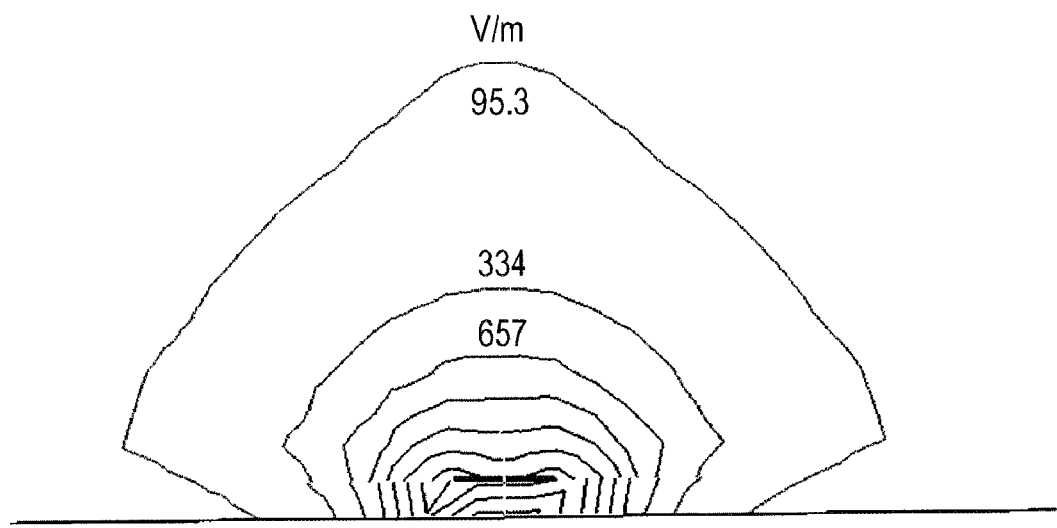
FIG. 3A shows an EMI radiation pattern on another type of power line.
Figure 3B:
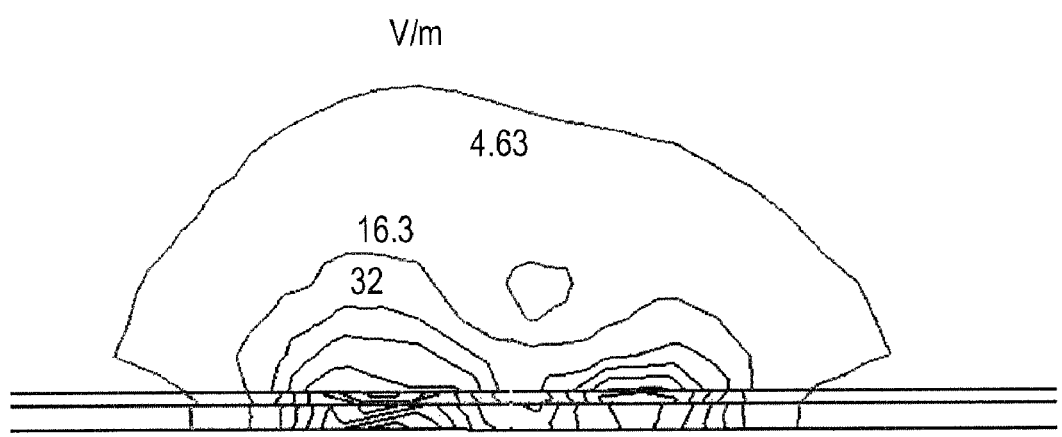
FIG. 3B shows and an EMI radiation pattern that may be generated by the power line arrangement of FIG. 1.

FIG. 3A shows an EMI radiation pattern generated by a conventional power line, e.g., one that does not have cross areas, and FIG. 3B shows an EMI radiation pattern generated by a power line formed in accordance with one or more embodiments previously described. As shown in FIG. 3A, the conventional power line radiates 95.3 V/m of EMI. In contrast, as shown in FIG. 3B, a maximum intensity of EMI radiated from power line 10 is merely 4.63 V/m. Thus, a power line formed according to the embodiments described herein achieves a significant reduction in EMI compared with a conventional power line.

As previously mentioned with respect to the embodiments shown in FIGS. 1 and 4, common-mode noise may be substantially reduced as a result of current flowing in different or opposite directions at every cross area. As the number of cross areas increases, the adverse effects produced by common-mode noise (and its associated EMI) are remarkably reduced.

In FIG. 1, the power lines are shown to be separated by a predetermined distance "d" in the cross area. According to one embodiment, an elevation in noise reduction may be realized when the power lines are closer to one another. In some circumstances, it may therefore be advantageous to arrange the power lines to be as close to one another as possible.

FIG. 4 one arrangement of connections between power line 10 and one or more elements 30, which, for example, may be one or more electronic devices mounted on a common plane or circuit board 100. While FIG. 4 shows the connection of a power line having a plurality of cross areas, this similar connections may be formed for a power line having only one cross area as shown in FIG. 1.

Referring to FIG. 4, power line 10 includes a main power line 15 and at least one sub-power line 16. The main power line is formed from a pair of main power lines, 15b and 15c, which branch off from one end 15a of power line 10. The main power lines may be connected to a power supply and may extend away from each other at the branch point. As shown, in this embodiment the main power lines are disposed in a twisted or chained form having at least one cross area. In each cross area, current flows in different or opposite directions as a result of the twisted or chain arrangement. The main power lines recombine at end 15d, which, for example, may terminate with a constant resistance or which may be left opened according to requirement of the overall device or board.

Each sub-power line 16 provides a current path between the main power lines 15b and 15c and a respective one of elements 30. Each sub-power line may also be formed from a pair of sub-power lines. For example, sub-power lines 16b and 16c may respectively extend from branch points 15e and 15f in main power lines 15b and 15c. The sub-power lines 16b and 16c have at least one cross area, where current in the sub-power lines flow in different or opposite directions. The sub-power lines 16b and 16c recombine at end 16d, which, for example, may be connected to a power input of element 31. The main power line 15 may be connected to the other elements 32 and 33 by sub-power line pairs similar to the ones connected to element 31 or a different sub-power line arrangement may be used.

In FIG. 4, elements 31 to 33 may be mounted in different regions 101 to 103 of the same plane of board 100. End 15a of the main power line may be coupled to a power supply and end 15d may be coupled to ground or a termination component or element.

Figure 5:
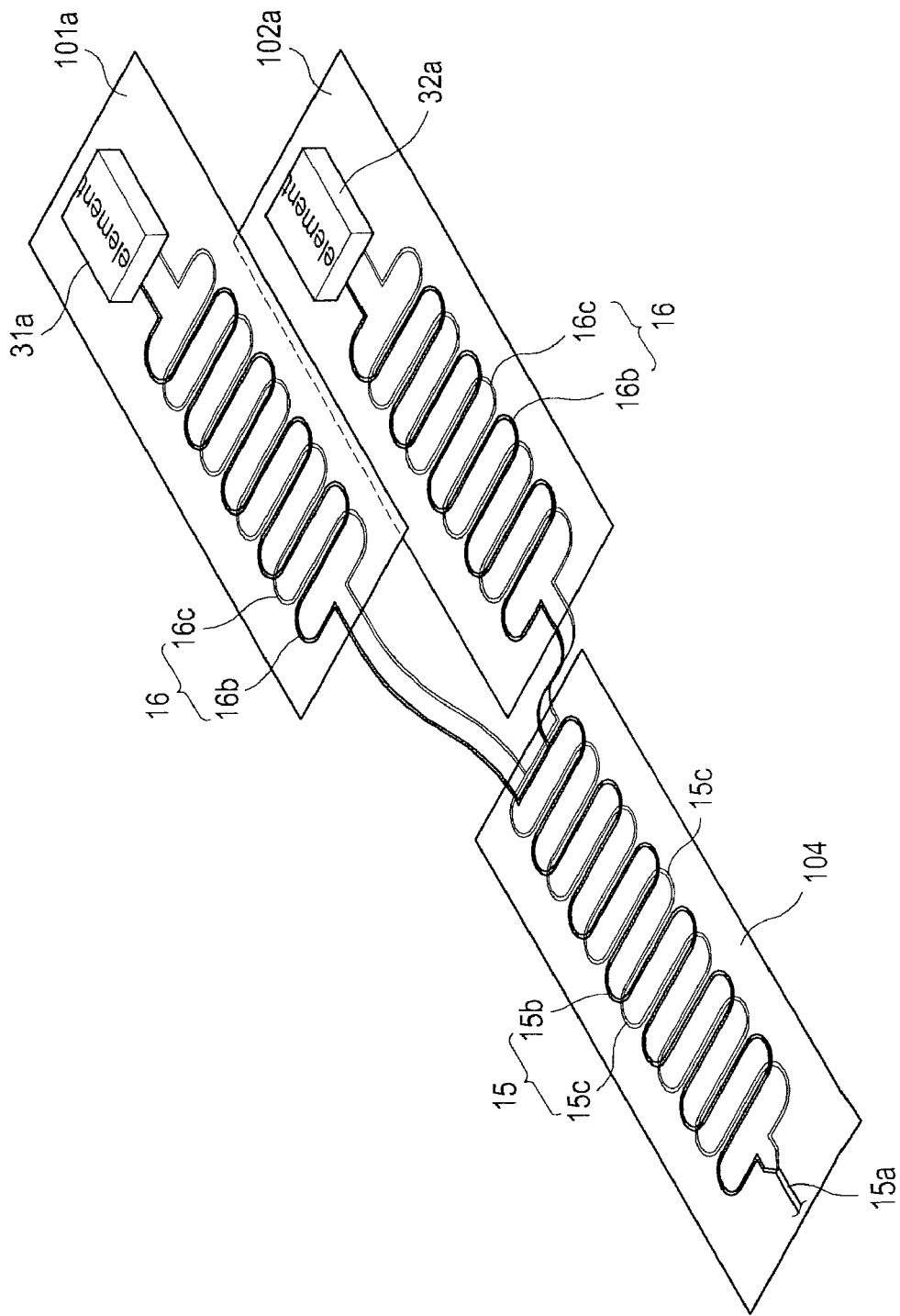
FIG. 5 is a diagram showing another arrangement of connections between one or more power lines formed according to the embodiment of FIG. 1 and other electronic devices.

In accordance with another embodiment, the elements may be formed on different layers or planes or on different circuit boards. For example, as shown in FIG. 5, elements 31a and 32a may be mounted on different layers 101a and 102a, respectively, and main power line 15 may be configured on another layer 104. Alternatively, main power line 15 may be configured on layer 101a or 102a where element 31a or 31b is mounted. Each sub-power line 16 may be formed on a respective one of layers 101a and 102a to connect corresponding elements to the main power line.

Figure 6:
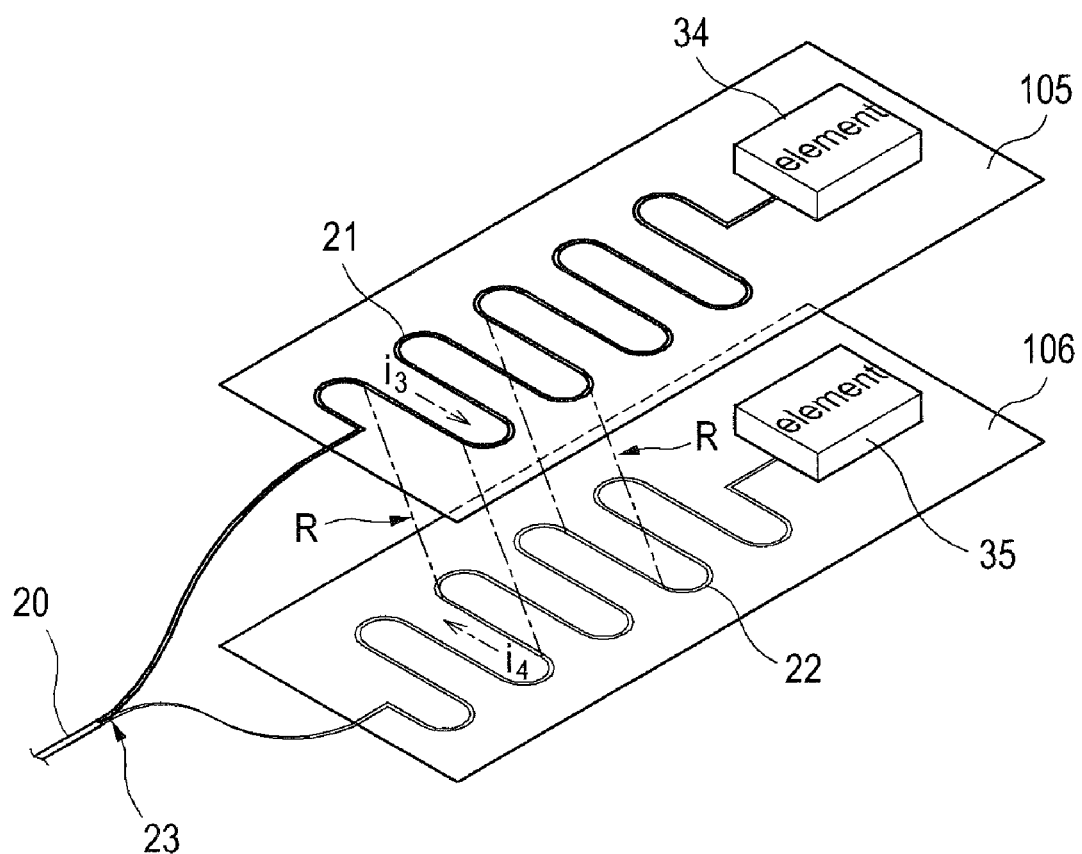
FIG. 6 is a diagram showing another arrangement of connections between one or more power lines formed according to the embodiment of FIG. 1 and other electronic devices.

FIG. 6 shows an arrangement in which elements 34 and 35 are mounted on different boards 105 and 106 and connected to a power line 20. The power line 20 branches off into power lines 21 and line 22. If power line 20 is a power line coupled to a main power line which is coupled to a power supply, then power lines 21 and 22 may be considered sub-power lines. Alternatively, power line 20 may be connected directly to a power supply.

Power lines 21 and 22 branch off at end 23 to respectively provide power to elements 34 and 35 mounted on different boards 105 and 106. Boards 105 and 106 may be aligned so as to define one or more cross regions R relative to power lines 21 and 22. The directions of the currents $i_3$ and $i_4$ flowing in these lines at the cross areas are different or opposite to one another. As a result, common-mode noise components (and attendant EMI) generated by currents $i_3$ and $i_4$ can be reduced or eliminated according to the principles previously described.

Thus, in accordance with one or more embodiments described herein, each power line effectively functions as a common-mode noise filter at the cross regions. As a result, induction of common-mode noise from the power lines can be efficiently prevented. And, since the common-mode noise can be reduced without using additional devices, manufacturing cost and complexity can be substantially reduced compared with conventional methods. Moreover, a board that incorporates a power-line arrangement according to the embodiments described herein can prevent EMI from adversely affecting electronic devices connected to or in the vicinity of the power lines, thereby ensuring stable operation. Further, EMI radiation from the power lines can be reduced, thereby further ensuring stable operation.

Any reference in this specification to "one embodiment," "an embodiment," "example embodiment," etc., means that a particular feature, structure or characteristic described in connection with the embodiment is included in at least one embodiment of the present invention. The appearances of such phrases in various places in the specification are not necessarily all referring to the same embodiment. Further, when a particular feature, structure or characteristic is described in connection with any embodiment, it is submitted that it is within the purview of one skilled in the art to affect such feature, structure or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power line arrangement, comprising:
a first power line;
a second power line which crosses the first power line at least once; and
a third power line coupled to the first and second power lines, wherein:
the third power line carries a first current which is divided into second and third currents which respectively flow through the first and second power lines,
the first current is divided into the second current and third current at a first connection point which connects the first, second, and third power lines to one another, the second and third currents flowing in a same direction into the first and second power lines at the first connection point,
the first and second power lines are coupled to a same power supply through the third power line, and wherein current in the first power line flows in a different direction from current in the second power line at an area where the first and second power lines cross.

2. The power line arrangement of claim 1, wherein the first power line is arranged relative to the second power line at said cross area, so that the first power line induces a noise component in the second power line that at least partially cancels noise generated by the second power line.

3. The power line arrangement of claim 2, wherein an amount of noise canceled in the second power line by the noise induced from the first power line is proportional to a spacing between the first and second power lines at said cross area.

4. The power line arrangement of claim 2, wherein an amount of noise canceled in the second power line by the noise induced from the first power line is proportional to widths of the first and second power lines.

5. The power line arrangement of claim 1, wherein each of the first and second power lines have a first end and a second end, and wherein the first ends of the first and second power lines branch off in different directions at the first connection point and the second ends of the first and second power lines recombine at a second connection point, said cross area positioned between the first and second points.

6. The power line arrangement of claim 2, wherein the first and second power lines are arranged to be at least substantially parallel at said cross area.

7. The power line arrangement of claim 6, wherein the first and second lines have substantially a same resistance.

8. The power line arrangement of claim 7, wherein noise canceled in the second power line by the noise induced from the first power line is based on the following equation:

$n_{r2} = (1-k)n_{c2}$ where $n_{r2}$ corresponds an amount of noise canceled in the second power line by noise induced from the first power line, $n_{r2}$ corresponds to an amount of noise generated by the second power line, and k is a coupling coefficient that corresponds to at least one of a spacing between the first and second power lines or widths of the first and second power lines.

9. The power line arrangement of claim 8, wherein the coupling coefficient k becomes larger as the distance between the first and second power lines becomes smaller.

10. The power line arrangement of claim 1, wherein the first and second power lines cross at a plurality of areas.

11. The power line arrangement of claim 10, wherein said plurality of crossed areas of the first and second power lines serve to mutually reduce common-mode noise generated by the first and second power lines based on a geometric progression.

12. The power line arrangement of claim 1, wherein said crossed area of the first and second power lines serve to mutually reduce common-mode noise generated by the first and second power lines.

13. The power line arrangement of claim 12, wherein an amount of common-mode noise reduced in the first and second power lines is at least substantially equal.

14. The power line arrangement of claim 1, wherein the first and second power lines are coupled to provide power to a same electronic device.

15. The power line arrangement of claim 1, wherein the third power line is coupled directly to the first and second power lines without any intervening bonding pads.

16. The power line arrangement of claim 1, wherein the first and second power lines carry the second and third currents in the same direction along first lengths, carry the second and third currents in opposite directions along second lengths, and carry the second and third currents in the same direction along third lengths, wherein the cross area includes the second lengths and the second lengths are respectively between the first and third lengths.

17. The power line arrangement of claim 1, wherein the second current is not derived from the third current and the third current is not derived from the second current.

* * * * *